United States Patent
Clark et al.

(10) Patent No.: US 11,626,325 B2
(45) Date of Patent: Apr. 11, 2023

(54) METHOD OF MAKING A SILICON CARBIDE INTEGRATED CIRCUIT

(71) Applicant: Raytheon Systems Limited, Glenrothes (GB)

(72) Inventors: David Trann Clark, Glenrothes (GB); Robin Forster Thompson, Dunfermline (GB)

(73) Assignee: Raytheon Systems Limited, Glenrothes (GB)

( * ) Notice: Subject to any disclaimer, the term of this patent is extended or adjusted under 35 U.S.C. 154(b) by 0 days.

(21) Appl. No.: 17/818,402

(22) Filed: Aug. 9, 2022

(65) Prior Publication Data
US 2022/0384643 A1    Dec. 1, 2022

Related U.S. Application Data

(62) Division of application No. 15/952,665, filed on Apr. 13, 2018, now Pat. No. 11,450,568.

(30) Foreign Application Priority Data

Apr. 13, 2017  (GB) ...................................... 1705983

(51) Int. Cl.
*H01L 21/82* (2006.01)
*H01L 27/06* (2006.01)
(Continued)

(52) U.S. Cl.
CPC ...... *H01L 21/8213* (2013.01); *H01L 27/0605* (2013.01); *H01L 27/0623* (2013.01);
(Continued)

(58) Field of Classification Search
CPC ............. H01L 21/8238; H01L 21/8213; H01L 21/046; H01L 27/0605; H01L 27/0623;
(Continued)

(56) References Cited

U.S. PATENT DOCUMENTS 3,504,181 A    3/1970  Chang et al.
4,812,891 A    3/1989  Bingham
(Continued)

FOREIGN PATENT DOCUMENTS

CN    107946355 A    4/2018
EP    0 405 045 A1    1/1991
(Continued)

OTHER PUBLICATIONS

Claims as Filed for International Application No. GB1705989.0; 6 Pages.
(Continued)

*Primary Examiner* — Nduka E Ojeh
*Assistant Examiner* — Eric W Jones
(74) *Attorney, Agent, or Firm* — Daly Crowley Mofford & Durkee, LLP

(57) ABSTRACT

The method of manufacturing an integrated circuit includes obtaining a silicon carbide substrate of a first conductivity type having an epitaxial layer of a second conductivity type thereon. A dopant is implanted in the epitaxial layer to form a first region of the first conductivity type that extends the full depth of the epitaxial layer. A first transistor is formed in the first region and a second transistor is formed in the epitaxial layer.

17 Claims, 6 Drawing Sheets

(51) Int. Cl.
| | |
|---|---|
| *H01L 29/735* | (2006.01) |
| *H01L 29/10* | (2006.01) |
| *H01L 29/66* | (2006.01) |
| *H01L 29/78* | (2006.01) |
| *H01L 21/04* | (2006.01) |
| *H01L 29/16* | (2006.01) |
| *H01L 27/092* | (2006.01) |
| *H01L 27/082* | (2006.01) |

(52) U.S. Cl.
CPC ...... *H01L 27/0635* (2013.01); *H01L 29/1008* (2013.01); *H01L 29/6625* (2013.01); *H01L 29/66068* (2013.01); *H01L 29/735* (2013.01); *H01L 29/7824* (2013.01); *H01L 21/046* (2013.01); *H01L 27/0629* (2013.01); *H01L 27/082* (2013.01); *H01L 27/0922* (2013.01); *H01L 29/1608* (2013.01); *H01L 29/78* (2013.01); *H01L 29/7835* (2013.01)

(58) Field of Classification Search
CPC ............. H01L 27/0635; H01L 27/0629; H01L 27/082; H01L 27/0922; H01L 29/1008; H01L 29/66068; H01L 29/6625; H01L 29/735; H01L 29/1608; H01L 29/78; H01L 29/7835
USPC .......................................................... 257/77
See application file for complete search history.

(56) References Cited

U.S. PATENT DOCUMENTS

| | | | |
|---|---|---|---|
| 5,041,895 | A | 8/1991 | Contiero et al. |
| 5,093,576 | A | 3/1992 | Edmond et al. |
| 5,149,663 | A | 9/1992 | Chai et al. |
| 5,917,204 | A | 6/1999 | Bhatnagar et al. |
| 5,953,600 | A | 9/1999 | Gris |
| 5,969,378 | A | 10/1999 | Singh |
| 6,649,982 | B2 | 11/2003 | Pan et al. |
| 6,703,647 | B1 | 3/2004 | Garcia et al. |
| 9,318,585 | B1 | 4/2016 | Cai et al. |
| 9,368,537 | B1 | 6/2016 | Holmes et al. |
| 9,966,459 | B2 | 5/2018 | Senapati et al. |
| 10,276,700 | B2 | 4/2019 | Senapati et al. |
| 10,665,703 | B2 | 5/2020 | Clark et al. |
| 2003/0087466 | A1 | 5/2003 | Wang et al. |
| 2005/0067653 | A1 | 3/2005 | Litwin et al. |
| 2006/0261876 | A1 | 11/2006 | Agarwal et al. |
| 2007/0037357 | A1 | 2/2007 | Culp |
| 2007/0105301 | A1 | 5/2007 | Chen et al. |
| 2007/0254398 | A1 | 11/2007 | Wakabayashi et al. |
| 2008/0283926 | A1 | 11/2008 | Sridhar |
| 2010/0059850 | A1 | 3/2010 | Harris |
| 2010/0213504 | A1 | 8/2010 | Ko et al. |
| 2010/0252860 | A1 | 10/2010 | Yang et al. |
| 2011/0101375 | A1 | 5/2011 | Zhang |
| 2013/0187173 | A1 | 7/2013 | Domeij et al. |
| 2013/0187256 | A1 | 7/2013 | Shirai |
| 2014/0028387 | A1 | 1/2014 | Saunders |
| 2014/0084301 | A1 | 3/2014 | Cai et al. |
| 2015/0349186 | A1 | 12/2015 | Hsu et al. |
| 2016/0071837 | A1 | 3/2016 | Lee et al. |
| 2016/0071962 | A1 | 3/2016 | Senapati et al. |
| 2016/0133731 | A1 | 5/2016 | Song |
| 2016/0315211 | A1 | 10/2016 | Chandrashekhar et al. |
| 2017/0148873 | A1 | 5/2017 | Kim et al. |
| 2018/0301379 | A1 | 10/2018 | Clark et al. |

FOREIGN PATENT DOCUMENTS

| | | |
|---|---|---|
| EP | 0 438 167 A1 | 7/1991 |
| EP | 1 253 645 A2 | 10/2002 |
| EP | 0 894 339 B1 | 3/2004 |
| GB | 2538348 A | 11/2016 |
| GB | 2543420 A | 4/2017 |
| JP | S 5619653 A | 2/1981 |
| WO | WO 97/39485 | 10/1997 |
| WO | WO 2007/128075 A2 | 11/2007 |
| WO | WO 2014/018156 A1 | 1/2014 |

OTHER PUBLICATIONS

Combined Search and Examination Report under Section 17 and 18(3) dated Aug. 18, 2017 for International Application GB1705989.0; 9 Pages.
Combined Search and Examination Report under Section 17 and 18(3) dated Aug. 21, 2017 for International Application GB1705986.6; 9 Pages.
Response (with Claims) to Great Britain Examination Report dated Aug. 21, 2017 for Application No. 1705986.6; Response filed Jul. 26, 2018; 7 Pages.
Great Britain Further Examination Report dated Aug. 29, 2018 for Application No. 1705986.6; 6 Pages.
Great Britain Further Examination Report dated May 10, 2019 for Great Britain Application No. GB1705986.6; 5 Pages.
Combined Search and Examination Report under Section 17 and 18(3) dated Sep. 26, 2017 for International Application GB1705983.3; 9 Pages.
Response (with Amended Claims) to Combined Search and Examination Report under Sections 17 and 18(3) dated Sep. 26, 2017 for Great Britain Application No. GB1705983.3; Response filed Apr. 15, 2019; 34 Pages.
Intention to Grant dated Aug. 22, 2019 for Great Britain Application No. GB1705983.3; 2 Pages.
Restriction Requirement dated Apr. 4, 2019 for U.S. Appl. No. 15/952,877; 7 Pages.
Response to Restriction Requirement dated Apr. 4, 2019 for U.S. Appl. No. 15/952,877; Response filed Apr. 25, 2019; 1 Page.
U.S. Non-Final Office Action dated Jul. 11, 2019 for U.S. Appl. No. 15/952,877; 16 Pages.
Response to U.S. Non-Final Office Action dated Jul. 11, 2019 for U.S. Appl. No. 15/952,877; Response filed Sep. 4, 2019; 11 Pages.
U.S. Ex parte Quayle Office Action dated Dec. 12, 2019 for U.S. Appl. No. 15/952,877; 6 Pages.
Response to U.S. Ex parte Quayle Office Action dated Dec. 12, 2019 for U.S. Appl. No. 15/952,877; Response filed on Dec. 19, 2019; 8 Pages.
U.S. Notice of Allowance dated Jan. 28, 2020 for U.S. Appl. No. 15/952,877; 7 Pages.
Van Zeghbroeck, "Chapter 5: Bipolar Junction Transistors;" from *Principles of Semiconductor Devices*; Jan. 2011; Available from: https://ecee.colorado.edu/~bart/book/book/chapter5/ch5_8.htm; 2 Pages.
Analog Devices Wiki, "Chapter 8: Transistors;" Apr. 29, 2014; Available from: https://wiki.analog.com/university/courses/electronics/text/chapter-8?rev=1398779534; 20 Pages.
U.S. Restriction Requirement dated Sep. 3, 2019 for U.S. Appl. No. 15/952,665; 7 Pages.
Response to U.S. Restriction Requirement dated Sep. 3, 2019 for U.S. Appl. No. 15/952,665; Response filed Oct. 22, 2019; 8 Pages.
U.S. Non-Final Office Action dated Feb. 14, 2020 for U.S. Appl. No. 15/952,665; 15 Pages.
Response to U.S. Non-Final Office Action dated Feb. 14, 2020 for U.S. Appl. No. 15/952,665; Response filed May 14, 2020; 14 Pages.
U.S. Final Office Action dated Aug. 24, 2020 for U.S. Appl. No. 15/952,665; 14 Pages.
Response to U.S. Final Office Action dated Aug. 24, 2020 for U.S. Appl. No. 15/952,665; Response filed Nov. 24, 2020; 13 Pages.
U.S. Non-Final Office Action dated Jul. 9, 2021 for U.S. Appl. No. 15/952,665; 14 Pages.
Response to U.S. Non-Final Office Action dated Jul. 9, 2021 for U.S. Appl. No. 15/952,665; Response filed Oct. 12, 2021; 16 Pages.
U.S. Final Office Action dated Dec. 6, 2021 for U.S. Appl. No. 15/952,665; 15 Pages.
Response to U.S. Final Office Action dated Dec. 6, 2021 for U.S. Appl. No. 15/952,665; Response filed Jan. 14, 2022; 10 Pages.

(56) References Cited

OTHER PUBLICATIONS

U.S. Notice of Allowance dated May 11, 2022 for U.S. Appl. No. 15/952,665; 10 Pages.

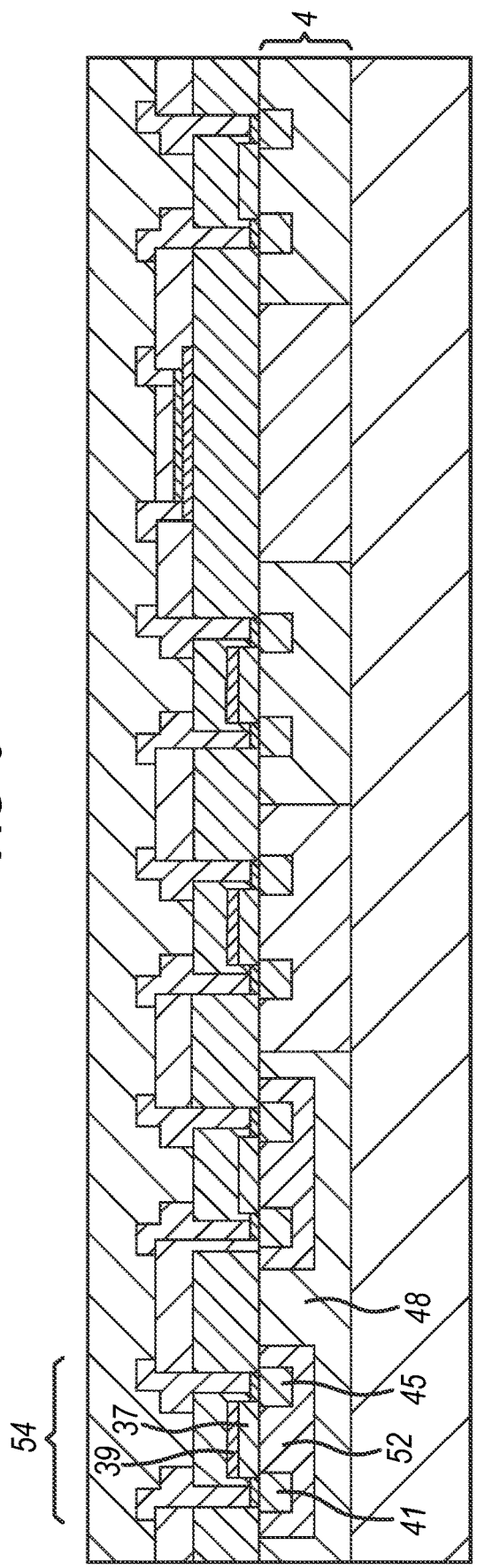

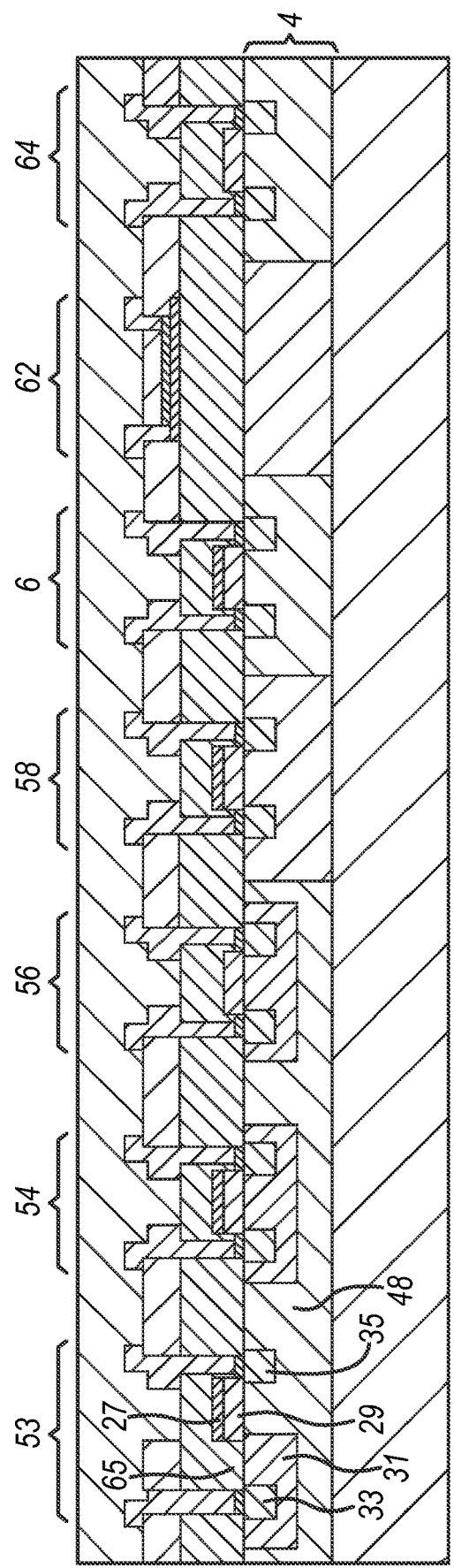

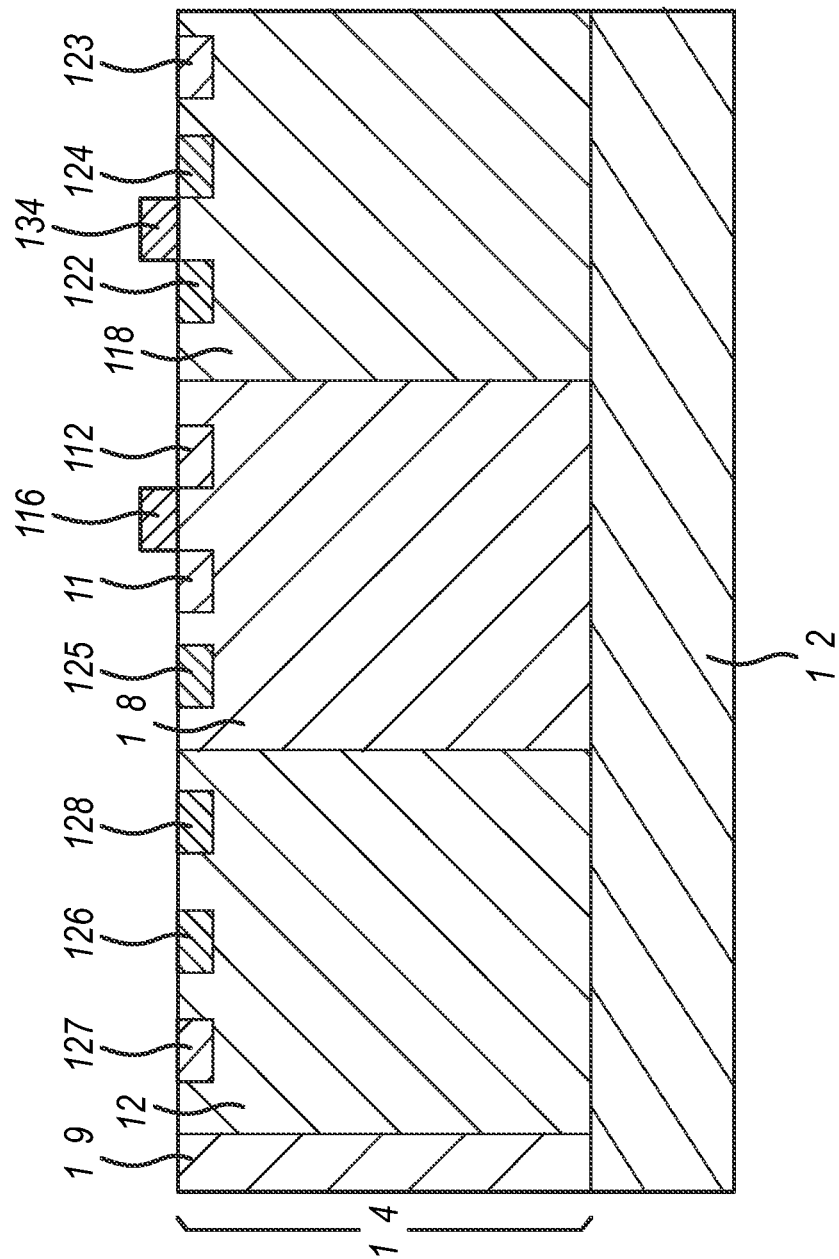

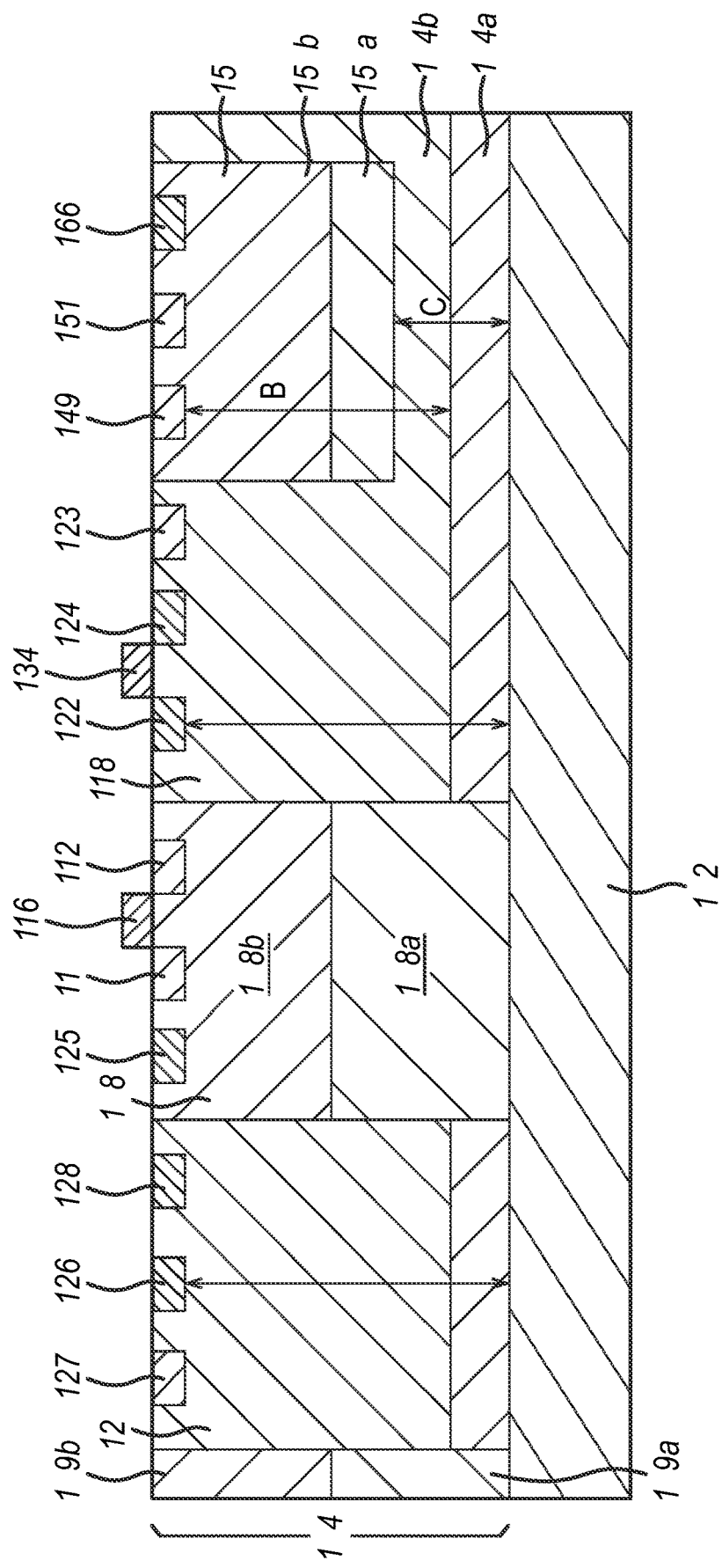

METHOD OF MAKING A SILICON CARBIDE INTEGRATED CIRCUIT

CROSS REFERENCE TO RELATED APPLICATIONS

This application is a Divisional application of U.S. patent application Ser. No. 15/952,665 filed on Apr. 13, 2018 entitled "SILICON CARBIDE INTEGRATED CIRCUIT," which claims priority to UK Patent Application Number 1705983.3 filed on Apr. 13, 2017 in the UK Intellectual Property Office, the entire disclosures of which are incorporated herein by reference.

BACKGROUND

The present invention relates to a method of manufacturing an integrated circuit. The present invention also relates to an integrated circuit.

Silicon carbide (SiC) is a semiconductor with a range of useful properties such as large breakdown electric field strength, large saturated electron drift velocity, small dielectric constant, reasonably high electron mobility and high thermal conductivity. It is therefore a candidate material for producing power devices especially for high temperature and/or high voltage applications.

There is an interest in providing complementary metal-oxide-semiconductor (CMOS) devices in monolithic silicon carbide. This requires the presence of both p-channel and n-channel metal oxide semiconductor field effect transistors (MOSFETs) in a single silicon carbide die. A p-channel MOSFET has p-type source and drain regions separated by an n-type region, while an n-channel MOSFET has n-type source and drain regions separated by a p-type region.

The prospect of BiCMOS devices is also desirable. BiCMOS devices incorporate bipolar junction transistors and CMOS transistors in a single integrated circuit.

A manufacturing process is therefore required for producing both p-type and n-type regions in a single silicon carbide die in order to produce functioning CMOS and bipolar junction devices.

Field effect transistors of different types have been previously formed in silicon carbide by utilising a, so-called, well structure. In this manner, two different field effect transistors can be incorporated into the same substrate. For example, a silicon carbide substrate with p-type conductivity can be used as a starting material. Subsequently, an n-type well is implanted within the p-type substrate material. Next, an n-type source region and an n-type drain region are implanted outside of the well region so as to form a field effect transistor with an n-channel.

Also, a p-type source region and a p-type drain region are formed in the well area to form a p-channel field effect transistor. The gate dielectric layer and the gate electrode are then formed on top. This approach allows the formation of one type of transistor in the well and the other type of transistor in the substrate outside the well.

SUMMARY

It is an aim of the present invention to improve existing integrated circuit devices produced in silicon carbide.

Accordingly, the present invention provides a method of manufacturing an integrated circuit, wherein the method comprises the following steps: obtaining a silicon carbide substrate of a first conductivity type, wherein a silicon carbide epitaxial layer of a second conductivity type is present on the silicon carbide substrate; implanting a dopant of a first type in the epitaxial layer to form a first region of the first conductivity type within the epitaxial layer of the second conductivity type, wherein the first region of the first conductivity type extends the depth of the epitaxial layer to the substrate; and forming a first transistor of a first junction-type in the first region of the first conductivity type and a second transistor of a second junction-type in the epitaxial layer of the second conductivity type.

The approach of implanting a dopant in order to form a first conductivity type region that connects to the substrate that is also a first conductivity type allows the use of one implantation region to divide and potentially isolate multiple regions of the epitaxial layer of the second conductivity type. This is particularly important in silicon carbide. Silicon carbide has a relatively low rate of diffusion and so implanted regions need to be formed without the need for subsequent diffusion. This can lead to the use of relatively high implantation energies which can cause damage to the crystal structure of the silicon carbide. By minimising the implantation that has to be carried out the quality of the resulting devices can be increased.

The form of the silicon carbide substrate is not particularly limited provided that it is a single crystal form. For example, the crystalline structure of the silicon carbide can be 3C, 4H, or 6H. The crystalline form 4H is particularly useful due to the high quality nature of the wafers that are commercially available.

The surface orientation of the silicon carbide substrate can be chosen as required by the application. For example, the 4H silicon carbide substrate is commercially available with an on-axis surface orientation relating to the {0001} planes, as well as oriented 4 degrees off this axis towards the <1120> directions or 8 degrees towards these directions. It has been found that the 4 degree off-axis orientation was effective.

As noted above, the silicon carbide substrate has a first conductivity type. When referring to conductivity types, this refers to the semiconductor either having an n-type conductivity (i.e., electrons are the majority carriers) or a p-type conductivity (i.e., holes are the majority carriers). Therefore, when it is stated that there is a first conductivity type, this can be either the n-type or p-type conductivity type. When it is stated that there is a second conductivity type, this second conductivity type is necessarily different from the first conductivity type. For example, if the first conductivity type is n-type conductivity, then the second conductivity type is necessarily p-type conductivity and vice versa.

In order for the silicon carbide to have an n-type conductivity, it must contain an n-type dopant. Examples of n-type dopants in silicon carbide include nitrogen and phosphorus. In a similar manner, in order for the silicon carbide to have a p-type conductivity, it must contain a p-type dopant. Examples of p-type dopants include boron and aluminium.

The silicon carbide substrate has a silicon carbide epitaxial layer grown on its surface. As stated, the silicon carbide epitaxial layer has a second conductivity type relative to the first conductivity type of the silicon carbide substrate. In other words, the majority charge carrier in the silicon carbide epitaxial layer is different to the majority charge carrier in the silicon carbide substrate. For example, the silicon carbide substrate may be an n-type silicon carbide while the epitaxial layer is a p-type silicon carbide.

A dopant of a first type is implanted into the epitaxial layer so as to form a first region of the first conductivity type within the epitaxial layer of the second conductivity type. In other words, implantation is carried out in order to form a region that has the same conductivity type as the substrate, but different to the epitaxial layer. Accordingly, the dopant of the first type must be suitable for forming a region of a first conductivity type. For example, assuming that the first conductivity type is n-type conductivity, then the dopant of the first type will be an n-type dopant such as nitrogen or phosphorus.

When implanting dopant of the first type into the epitaxial layer of the second conductivity type, the dopant of the first type must be implanted to a sufficient concentration to counter-dope the second conductivity type epitaxial layer. This will provide sufficient charge carriers to the first region of the epitaxial layer so as to ensure it is changed from being of the second conductivity type to being of the first conductivity type.

This first region that is implanted into the epitaxial layer extends the depth of the epitaxial layer to the substrate. Accordingly, there is implanted a continuous region of first conductivity type that extends from the upper surface of the epitaxial layer to the lower surface of the epitaxial layer in contact with the substrate. In this manner, this one implanted region of the first conductivity type can be used to divide the epitaxial layer of a second conductivity type into distinct regions that are separated by the first region. These distinct regions are defined by the implanted first region and the substrate that are all of a first conductivity type. This is a particularly efficient way of producing different regions that can be isolated and utilised to form various different devices.

In the present invention, a first transistor of a first junction type is formed in the first region and a second transistor of a second junction type is formed in the epitaxial layer of the second conductivity type. The first and the second transistors are thus formed in two distinct regions, which can be isolated from each other by each region being of a different conductivity type.

When used herein, the term "transistor" covers any form of transistor that can be formed in a monolithic semiconductor material. For example, the transistor can be a field effect transistor (such as a MOSFET) or a bipolar junction transistor. When a transistor is described as a field effect transistor, it necessarily has a gate electrode for controlling its operation. When a transistor is described as a bipolar junction transistor it does not have such a gate electrode that controls its operation.

In relation to the junction type of a transistor, this refers to the layout of the n-type and p-type regions. For example, a possible junction type is pnp. For a field effect transistor a pnp junction-type utilises p-type regions as the source and the drain of the transistor, these p-type regions being separated by an n-type region. In relation to a bipolar junction transistor, a pnp type junction utilises the p-type regions as the collector and emitter and the n-type region as the base. An alternative junction-type is npn where the source/collector and drain/emitter are formed from n-type regions separated by a p-type region.

The first transistor is formed in the first region. The first region has a first conductivity type and so the first transistor can be formed by implanting regions of the second conductivity type that are separated by the region of the first conductivity type to form a second-conductivity-type:first-conductivity-type:second-conductivity-type junction type for this transistor.

The second transistor is formed in the epitaxial layer of the second conductivity type. The second transistor can be formed by implanting two regions of the first conductivity type that are separated by the second conductivity type to form a transistor junction type of first-conductivity-type:second-conductivity-type:first-conductivity-type.

When the first conductivity type is n-type conductivity and the second conductivity type is p-type conductivity, the first transistor is preferably a pnp-type junction and the second transistor is preferably an npn-type junction.

The first transistor and second transistor may be MOSFETs and so the above method provides a route for producing CMOS devices in silicon carbide.

The silicon carbide substrate may be heavily doped to be of the first conductivity type. The silicon carbide epitaxial layer may be lightly doped to be of the second conductivity type. The first region may be implanted with dopant of a first type so as to be lightly doped of the first conductivity type.

When used herein, reference to heavy doping, doping, and lightly doping can indicate a relative level of dopant. Accordingly, the heavily doped regions contain more dopant than the doped regions which in turn contain more dopant than the lightly doped regions. A heavily doped concentration may be in the range of greater than $1 \times 10^{19}$ cm$^{-3}$, and possibly greater than $1 \times 10^{20}$ cm$^{-3}$. In addition, the heavily doped regions may be less than $1 \times 10^{21}$ cm$^{-3}$. A lightly doped concentration may be in the range of less than $1 \times 10^{18}$ cm$^{-3}$, and possibly less than $1 \times 10^{17}$ cm$^{-3}$, or less than $5 \times 10^{16}$ cm$^{-3}$. A doped region can have a concentration in between that of the heavily doped region and the lightly doped region.

When referring to the concentration of dopant within regions there can be variation in concentration within the region. However, substantially all of the region will have a dopant concentration in the required range. In particular, all of the region may have a dopant concentration in the required range.

A particularly useful combination for use with the invention described herein utilises an n-type dopant for the dopant of the first type, n-type conductivity for the first conductivity type and p-type conductivity for the second conductivity type. Alternatively, the dopant of the first type may be a p-type dopant, the first conductivity type may be a p-type conductivity, and the second conductivity type may be an n-type conductivity.

It is particularly preferred, that when an n-type dopant is used as the dopant for implanting the first region, the n-type dopant is nitrogen. The relative light weight of nitrogen means it can be implanted to a considerable depth of the p-type epitaxial layer at a relatively low implantation energy. The damage resulting from the implantation is also relatively reduced. This is a particular advantage relative to implanting a p-type dopant in an n-type epitaxial layer. In such a scenario, it is common to utilise aluminium as the p-type dopant. The relative weight of aluminium means that high energies are required to implant it to a reasonable depth and there is greater resulting damage to silicon carbide material. Further, due to the higher ionisation energy of aluminium in silicon carbide relative to nitrogen, more aluminium implantation is required in order to provide an effective amount of dopant.

The need to utilise considerable implantation depths is particularly pertinent for silicon carbide relative to silicon due to the lower rate of dopant diffusion in silicon carbide relative to silicon. Therefore, it is important that the dopants are implanted at the depth where they are required.

By utilising the present invention it is possible to divide the epitaxial layer into a second region and a third region separated by the first region (i.e., two regions of second conductivity type in the epitaxial layer along with the first region of the first conductivity type that has been implanted).

When reference is made herein to a first region, second region, third region etc., these regions are discrete volumes of a certain conductivity type. For example, the second region of the second conductivity type and the third region of the second conductivity type are necessarily isolated from each other by the presence of a region of a first conductivity type. Accordingly, these different regions can contain separate components, which may or may not be connected together by other means such as metallisation layers on top of the epitaxial layer.

A second transistor may be formed in the second region of the second conductivity type, and a third transistor may be formed in the third region of the second conductivity type. In this way, three transistors can be incorporated into the SiC monolithic die. In general, the approach of the present invention can be utilised to form numerous isolated transistors into the SiC monolithic die.

The concentration of dopants can be controlled so as to minimise the influence of potential parasitic transistors while maintaining high gain of the desired transistors, for example the desired lateral transistors. The parasitic transistors can be orientated vertically, that is along the direction that runs from the surface of the epitaxial layer to the substrate. Parasitic transistors can be orientated laterally, that is along a direction that runs parallel to the surface of the epitaxial layer. The influence of either of these forms of parasitic transistor can be reduced by relatively increasing the presence of dopant between the junctions of the potential parasitic transistors. Alternatively, or in addition, the influence of either of these forms of parasitic transistor can be reduced by increasing the distance between the source/collector and drain/emitter of the parasitic transistors.

Lateral parasitic transistors can occur between adjacent regions. For example, a parasitic lateral transistor can exist between the source/drain of a second conductivity type in the first region, the body of the first region and the body of the adjacent second region of a second conductivity. Equivalent lateral parasitic transistors can exist anywhere where there is a series of alternating volumes of different conductivity types.

In order to reduce the influence of lateral parasitic transistors the dopant concentration can be increased within each region in the direction of the interface with a laterally adjacent region. This region of increased concentration is outside the active area of any desired transistor that may be present. This concentration increase reduces the gain and maximises punchthrough or threshold voltage associated with lateral parasitic transistors that may exist between the adjacent regions.

Vertical parasitic transistors are particularly relevant in relation to components formed in regions of the epitaxial layer of a second conductivity type. Components formed in these regions, such as transistors, can have regions of a first conductivity type. This creates a potential parasitic vertical transistor composed of the first conductivity type region in the component, the second conductivity type region in the body of the epitaxial layer and the first conductivity type region of the substrate along a vertical direction from the component to the substrate.

In order to reduce the influence of this parasitic vertical transistor, the concentration of the dopant of the second type in the epitaxial layer can be varied. The dopant of the second type is a dopant of the contrasting type to the dopant of the first type. For example, if the dopant of the first type is an n-type dopant then the dopant of the second type is a p-type dopant, and vice versa.

The dopant of the second type can be increased within the epitaxial layer towards the interface with the substrate. This increase is relative to the concentration of dopant between the junctions of the fabricated component, i.e., transistor. This allows a high gain to be maintained in, for example, the desired lateral transistor while reducing the gain and suppressing punchthrough associated with the vertical parasitic transistor. In particular, the concentration of the dopant of the second type within the second region will be greater towards an interface of the second region with the substrate relative to the concentration between the junctions of the second transistor within this region. Further, the concentration of the dopant of the second type within the third region may be greater towards the interface of the third region with the substrate relative to the concentration between the junctions of the third transistor.

The concentration of dopant between the junctions of the transistor is the concentration in the region that separates the source/collector and drain/emitter of the transistor. In other words, for an npn type junction it is the concentration of the p-type dopant in the p-type region between the two n-type regions.

The ability to create a first region of a first conductivity type, a second region of a second conductivity type, and a third region of a second conductivity type allows the production of BiCMOS devices on monolithic silicon carbide. That is, a combination of MOSFETs and bipolar junction transistors. For example, the first region may contain a PMOS transistor (a p-channel field effect transistor), the second region may contain an NMOS transistor (an n-channel field effect transistor), and the third region may contain an npn bipolar junction transistor.

In order to provide a further isolated region, it is possible to implant a dopant of the first type to form a fourth region of a first conductivity type in the epitaxial layer of the second conductivity type, wherein the fourth region is in the form of a well and does not extend the depth of the epitaxial layer to the substrate. The fourth region extends from the surface of the epitaxial layer opposite the substrate into the epitaxial layer. Therefore, in contrast to the first region, the fourth region is not in contact with the substrate and so is isolated from the first region. The implanting dopant of the first type to form a fourth region may be nitrogen, this will make the fourth region of n-type conductivity. The fourth region can be lightly doped.

The presence of the fourth region means the device comprises four isolated regions that are suitable for forming four components. In particular, the fourth region may comprise a fourth transistor. In this manner, it is possible to produce a full complementary BiCMOS device that includes, for example, a PMOS transistor in the first region, an NMOS transistor in the second region, an npn bipolar junction transistor in the third region, and a pnp bipolar junction transistor in the fourth region.

As described above in relation to the second and third regions, the fourth region can also have a varied dopant concentration in order to suppress potential vertical parasitic transistors. When a component is formed in the fourth region, such as a fourth lateral transistor, there is a potential parasitic vertical transistor between the region of second conductivity type of the fourth lateral transistor, the first conductivity type of the well and the second conductivity type beneath the well. In order to suppress this vertical transistor, the concentration of dopant of the first type in the fourth region may be greater towards the bottom of the fourth region. This increase in dopant concentration is relative to the concentration between the junctions of the component within the fourth region. The bottom of the fourth region lies between the component, i.e., transistor, and the substrate and is the greatest depth at which dopants have been implanted to form this region. This increase in dopant concentration suppresses the gain and punchthrough of the parasitic vertical transistor and thus suppresses its influence.

There is a further potential parasitic vertical transistor that results from the formation of the fourth region. This is caused by the first conductivity type of the well of the fourth region, the second conductivity type of the epitaxial layer below the fourth region, and the first conductivity type of the substrate. In order to suppress this potential parasitic vertical transistor, the concentration of dopant of a second type within the epitaxial layer near the interface with the substrate can be increased. Again, this will act to suppress the gain and punchthrough of this parasitic vertical transistor.

The increase in the amount of second dopant at the bottom of the epitaxial layer can be introduced during growth of the epitaxial layer or may be subsequently implanted. In particular, the epitaxial layer on the substrate may have a greater concentration of dopant of a second type toward the interface with the substrate along the full area of this interface.

In order to reduce manufacturing complexity, the dopant of the first type may be implanted simultaneously in the first region and the fourth region. In order to achieve this, the lower portion of the first region is implanted first from the substrate up to the level at which the fourth region doping is to begin. The remaining implantation then occurs simultaneously for the upper part of the first region and the entire fourth region.

As described in relation to the first transistor and second transistor above, the transistors in the various regions can be formed so that the source/collector and drain/emitter are of an opposite conductivity type to that of the bulk of the region. In this way the two junctions of the transistor are formed.

In the case of forming a transistor that is a field effect transistor, the channel type will be the same as the implanted source and drain regions, i.e. if the source and drain regions are of a first conductivity type, and they are implanted in a region of a second conductivity type, the channel type will be of the first conductivity type. In the case of forming a bipolar junction transistor, the collector and emitter will be of one conductivity type while the base will be of the other conductivity type, the collector and the emitter being the implanted regions and the base being the bulk conductivity type of that region.

For ease of production, the transistors have a lateral layout. That is, the various regions of the transistor are arranged along a surface of the epitaxial layer in a side-by-side arrangement. The various regions of the transistor are all be arranged along the same surface of the epitaxial layer, e.g., the upper surface. Specifically, for a MOSFET, the source, the drain and the active region between the source and the drain are all arranged along the same surface of the epitaxial layer. For a bipolar junction transistor, the collector, the base and the emitter are all arranged along the same surface of the epitaxial layer.

It is particularly preferred that the first transistor and the second transistor have a lateral layout, where the various regions of the first and second transistor are arranged along the same surface of the epitaxial layer. Further, when a third transistor is present, it is particularly preferred that the third transistor has a lateral layout, where the various regions of the third transistor are arranged along the same surface of the epitaxial layer, which is the surface along which the first and second transistor regions are arranged. Also, when a fourth transistor is present, it is particularly preferred that the fourth transistor has a lateral layout, where the various regions of the fourth transistor are arranged along the same surface of the epitaxial layer, which is the surface along which the first, second and third transistor regions are arranged.

The fourth transistor may be a bipolar junction transistor having a base type corresponding to the first conductivity type. Alternatively, a fourth transistor may be a field effect transistor having a channel type corresponding to the second conductivity type. In either case, the formation of the fourth transistor may comprise implanting a dopant of a second type to form collector/source and emitter/drain regions of the second conductivity type, and thus form a transistor of a second-conductivity-type:first-conductivity-type:second-conductivity-type junction type.

When forming the source/collector and emitter/drain regions of n-type conductivity and p-type conductivity, the n-type dopant and p-type dopant used are not particularly limited. A particularly useful n-type dopant is phosphorous due to its higher mass relative to nitrogen and so lower implantation depth in silicon carbide. A particularly useful p-type dopant is aluminium. The source/collector and emitter/drain regions may be heavily doped to be n-type conductivity or p-type conductivity as required.

The third transistor may be a bipolar junction transistor having a base type corresponding to the second conductivity type or a field effect transistor having a channel type corresponding to the first conductivity type. The third transistor can be formed by implanting dopants in the same manner as for the fourth transistor.

The first transistor and second transistor may each be one of a bipolar junction transistor or field effect transistor formed in a similar manner as described for the fourth transistor.

It is particularly preferred that the first, second, third and fourth transistors are a p-channel field effect transistor (PMOS), an n-channel field effect transistor (NMOS), an npn bipolar junction transistor and a pnp bipolar junction transistor. In this manner, a full complementary BiCMOS device is produced.

The method of forming the transistors involves implanting dopants to form the source/collector regions and drain/emitter regions. In order to reduce manufacturing complexity, the implantation steps for forming the various transistors can be combined. For example, all transistor regions of a first conductivity type can be implanted simultaneously, while all transistor regions of a second conductivity type are also implanted simultaneously.

When a field effect transistor is formed, the method further comprises the steps of depositing a gate dielectric layer to be present above the channel region of the field effect transistor and a gate electrode above this dielectric layer for controlling the transistor. The gate dielectric layer is not particularly limited and may be formed for example, from silicon dioxide. The gate material may be formed of molybdenum, polysilicon or aluminium, but is not particularly limited. A dielectric layer equivalent to the gate dielectric layer may also be formed above the bipolar junction transistors.

Further, interconnect layers may be present above the device in order to form functional interconnections between the various transistors.

Contacts to the terminals of the transistors may be formed as appropriate. These contacts may be formed from silicides.

The method described herein can be utilised to produce further regions for forming additional components. For example, the methods can further include forming a fifth region of a first conductivity type in the epitaxial layer of the second conductivity type, wherein the fifth region is in the form of a well and does not extend the depth of the epitaxial layer to the substrate, in a similar manner to the fourth region described herein. This fifth region may have a fifth transistor formed within it in a similar manner to the fourth transistor described herein. The fifth transistor may be a field effect transistor or a bipolar junction transistor of the first junction type.

The formation of further first conductivity regions in the form of wells allows for the formation of even more isolated components.

Such wells can also be utilised for forming a lateral LDMOS transistor. The LDMOS transistor can utilise the well of a first conductivity type to be the lightly doped drain extension region. A heavily doped region of a first conductivity type is formed in the well as part of the drain region, while a further heavily doped region of a first conductivity type is implanted in the epitaxial layer, separated from the well region, as the source region. Thick field dielectric is formed above the lightly doped drain extension to prevent thin gate dielectric being exposed to damagingly high gate to drain electric fields. A gate dielectric is formed over the channel region between the source and the drain and a gate electrode is formed on the gate dielectric but not substantially over the drain extension region of the LDMOS. This ensures a sufficient distance between the gate electrode and the drain of the well region that allows the application of a high voltage. It is possible that both the source and the drain are formed from wells of the first conductivity to have lightly doped source and drain extension regions containing a heavily doped region of the first conductivity. In this latter case, thick field oxide will be formed above the lightly doped extensions at both source and drain.

The present invention also relates to an integrated circuit formed by the methods described herein.

The present invention also relates to an integrated circuit comprising: a silicon carbide substrate of a first conductivity type; a silicon carbide epitaxial layer on the silicon carbide substrate, wherein the epitaxial layer comprises a first region of the first conductivity type, the first region comprising a first transistor of a first junction type; a second region of a second conductivity type, the second region comprising a second transistor of a second junction type; and a third region of the second conductivity type, the third region comprising a third transistor of the second junction type; wherein the first region, second region and the third region extend the depth of the epitaxial layer to the substrate.

The features described above with respect to the method of manufacturing an integrated circuit equally apply to the integrated circuit itself. In particular, a fourth region of the first conductivity type may be positioned within the third region, wherein the fourth region comprises a fourth transistor of the first junction-type.

DESCRIPTION OF THE DRAWINGS

The invention will now be described in detail with reference to the drawings.

FIG. 3 depicts a cross section of the integrated circuit of FIG. 2 additionally having a further p-channel transistor.

FIG. 4 depicts a cross section of the integrated circuit of FIG. 3 additionally having an LDMOS n-channel transistor.

FIG. 5 depicts a cross section of an integrated circuit in accordance with the present invention having a p-channel transistor, an n-channel transistor and an npn bipolar junction transistor.

FIG. 6 depicts a cross section of an integrated circuit in accordance with the present invention comprising a p-channel transistor, an n-channel transistor, a pnp bipolar junction transistor, and an npn bipolar transistor junction transistor.

DETAILED DESCRIPTION

Figure 1:
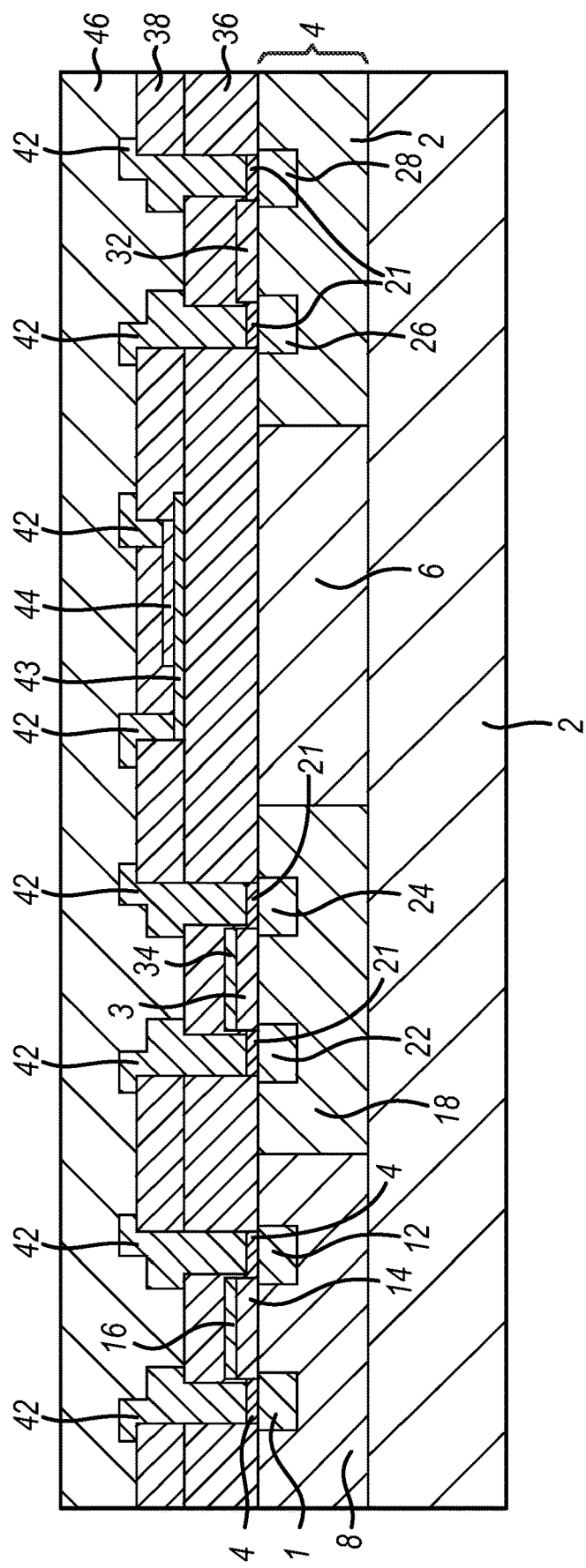
FIG. 1 depicts a cross section of an integrated circuit in accordance with the present invention having an n-channel transistor, a p-channel transistor and an npn bipolar transistor.

An integrated circuit according to the present invention is depicted in FIG. 1 in cross-section. The integrated circuit has a silicon carbide substrate 2 that is heavily doped with nitrogen to have n-type conductivity. The substrate has the 4H crystalline form. Grown on the substrate is a silicon carbide epitaxial layer 4. The epitaxial layer 4 contains a light doping of p-type dopant in the form of aluminium so as to have p-type conductivity.

Within the epitaxial layer 4 are implanted regions of n-type conductivity 6, 8 that have been formed by implanting nitrogen as an n-type dopant. These regions of n-type conductivity extend the full depth of the epitaxial layer 4 and contact the substrate 2. In this manner, the p-type epitaxial layer is made discontinuous in a lateral direction. Both of the n-type conductivity regions 6, 8 are lightly n-doped.

One of the n-type conductivity regions 8 has formed within it a source region 10 and a drain region 12 of heavily doped p-type conductivity. Along with gate dielectric 14 and gate electrode 16, a p-channel field effect transistor is formed. A heavily doped n-type region (not shown) can also be formed to form the connection to the bulk of the n-type conductivity region 8.

The presence of n-type conductivity regions 6, 8 results in two isolated p-type conductivity regions 18, 20. Both of these p-type conductivity regions 18, 20 contain heavily doped n-type conductivity regions 22, 24, 26, 28 that create the npn junctions of these transistors. Both transistors have a gate dielectric 30, 32 overlapping the region between the n-type conductivity regions. A transistor of one of the p-type conductivity regions 18 additionally has a gate electrode 34 resulting in an n-channel field effect transistor, while the other p-type conductivity region 20 does not have a gate electrode leaving this transistor as a bipolar junction transistor. Both p-type conductivity regions can have heavily doped p-type conductivity regions (not shown) that form part of the connection to the bulk of each region. For the bipolar junction transistor, this functions as the base contact.

Isolation layers 36, 38 are formed on the silicon carbide material. Ohmic contacts 21, 40 and interconnects 42 can be formed to each of the contacts of the transistors. These interconnects can connect each of the individual components to a circuit and to each other.

Optional additional components can form part of the integrated circuit, such as a capacitor or resistor. In particular, a capacitor formed from a first layer of polysilicon 43 and a second layer of polysilicon 44 is present above the isolation layer 36. An insulating layer (not shown) is present between the first layer of polysilicon 43 and the second layer of polysilicon 44.

Finally, the device can be sealed from the environment by layer 46 that may be a layer of silicon dioxide, Si—N or Si—O—N. Openings can be present in this layer so as to form connections to the interconnect metal pads where appropriate.

Figure 2:
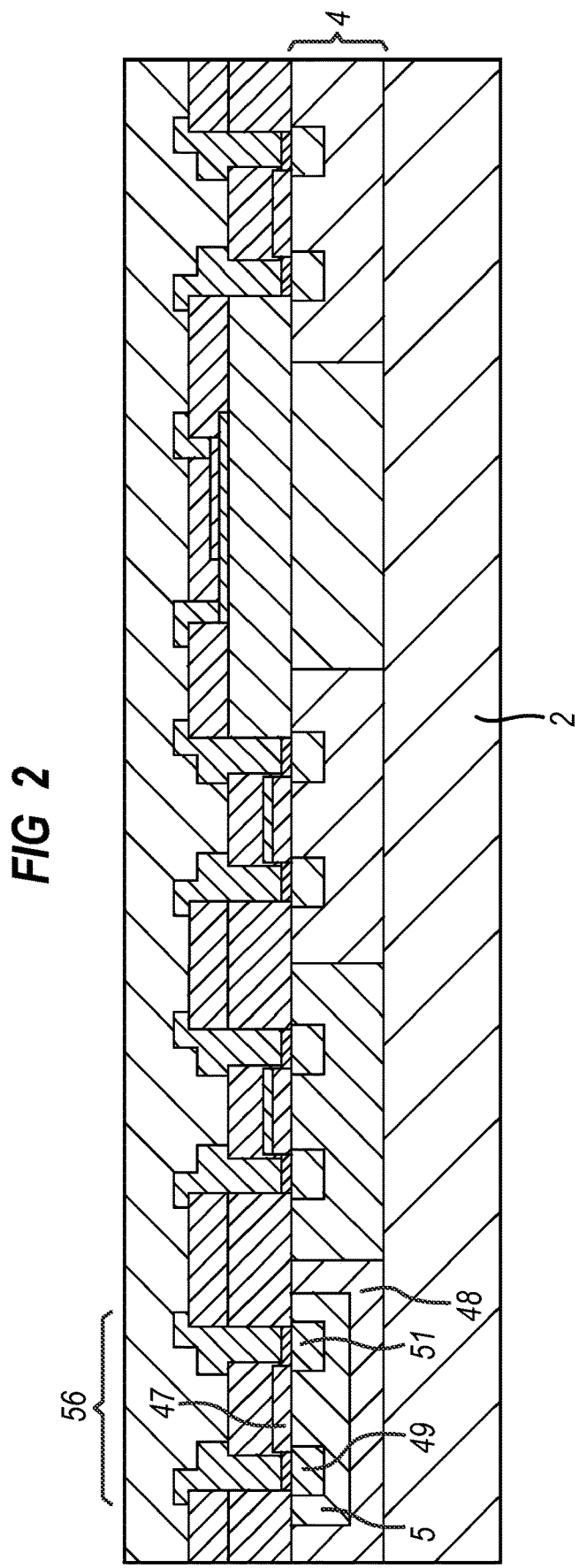
FIG. 2 depicts a cross section of the integrated circuit of FIG. 1 additionally having a pnp bipolar transistor.

The integrated circuit structure depicted in FIG. 1 can be utilised with further components. Such a further component is depicted in FIG. 2. Relative to FIG. 1, the integrated circuit of FIG. 2 has an additional bipolar junction transistor 56 at the left-most side. This bipolar junction transistor is formed in the p-type epitaxial region 48. The transistor is a pnp bipolar junction transistor and so the p-type conductivity region 48 contains an n-type conductivity region 50 that is in the form of a well that does not extend the complete depth of the epitaxial layer 4 and so does not contact the substrate 2. In this manner, the n-type conductivity well 50 is isolated from the substrate 2. Within the n-well structure, heavily doped p-type conductivity regions 49, 51 are formed as the collector and emitter of the bipolar junction transistor 56. As with the other transistors, a gate dielectric 47 can be formed to overlap the region between the heavily doped p-type conductivity regions 49, 51 but no gate electrode is formed. Contacts and interconnects can also be formed.

A further development of the integrated circuit is depicted in FIG. 3. The device of FIG. 2 is utilised but with the addition of a further p-channel field effect transistor 54 at the left-most side. This p-channel transistor 54 is formed in the p-type conductivity region 48 of epitaxial layer 4 where a further n-type conductivity well region 52 is formed containing the heavily doped p-type conductivity source and drain regions 41, 45 of the transistor. This transistor has the gate dielectric 37 and the gate electrode 39 along with interconnect layers and contacts.

Yet a further development of the integrated circuit is depicted in FIG. 4. Relative to the integrated circuit of FIG. 3, this integrated circuit has a further component at the left-most side of the device depicted in FIG. 3. This additional component is an LDMOS n-channel transistor 53 that is formed in the p-type conductivity region 48. The LDMOS has heavily doped n-type conductivity regions as the source and drain 33, 35 as well as a lightly n-doped region around the drain in the form of a lightly n-doped n-well 31 as the drain extension. It further has a gate dielectric 29 and gate electrode 27. The LDMOS 53 also has a thick field dielectric 65 to stop the destruction of the gate dielectric 29 by the very high gate-drain electric fields. Overall, the device of FIG. 4 has an LDMOS n-channel transistor 53, a p-channel field effect transistor 54, a pnp bipolar junction transistor 56, a p-channel field effect transistor 58, an n-channel field effect transistor 60, a capacitor/resistor 62 and an npn bipolar junction transistor 64.

The process for making such devices will now be described with reference to FIG. 5. FIG. 5 is a simplified diagram depicting the various regions of different conductivity in a device with a lateral NMOS, lateral PMOS and lateral npn bipolar transistors on the same SiC substrate.

For the substrate a heavily n-doped 4H silicon carbide Si-face substrate (wafer) 102 is used. On top of this substrate, a lightly doped p-type epitaxial layer 104 is formed.

A dielectric material (such as silicon dioxide) that is thick enough to block the subsequent ion implantation is deposited on top of the epitaxial layer 104. A pattern is defined in the dielectric such that areas to be retained as p-type epitaxial regions remain blocked by overlying dielectric, and areas to be implanted with n-type dopant have the dielectric removed.

A series of nitrogen implants, up to an energy of 2 MeV, are performed so that implanted lightly doped n-type regions 108, 109 that extend the full depth of the epitaxial layer 104 are formed. These n-type regions 108, 109 along with the substrate 102 define the p-type regions 118, 120. A low energy threshold adjust implant of either aluminium or nitrogen may also be performed at this stage. The dielectric layer is then removed.

Next, a further dielectric material layer that is thick enough to block the subsequent ion implantation is deposited on top of the wafer. A pattern is defined in the dielectric such that windows are opened where heavily doped n-type regions are required for the n-channel MOS device's source 122 and drain 124, the p-channel MOS device's body contact 125 and for the npn bipolar transistor's collector and emitter regions 126, 128. A series of shallow phosphorous implants are performed to create the required heavily doped n-type doping profile. The dielectric layer is then removed.

Dielectric material thick enough to block the subsequent ion implantation is again deposited on top of the wafer. A pattern is defined in the dielectric such that windows are opened where heavily doped p-type implanted regions are required for the p-channel MOS device source and drain regions 110, 112 and for the n-channel MOS device body contact 123 and the npn bipolar junction transistors body contact 127. A series of shallow aluminium implants are performed to create the required heavily doped p doping profile. The dielectric layer is then removed.

Dielectric material thick enough to block the subsequent ion implantation is deposited on top of the wafer. A pattern is defined in the dielectric such that windows are opened above the p-type region in areas where transistors will not be formed (to be referred to as field areas).

A series of shallow aluminium implants are performed to increase the p-type doping in the p-type field areas such that lateral parasitic npn bipolar junction or NMOS field transistors are turned off. The dielectric layers are then removed.

A thin dielectric layer (such as silicon dioxide) is deposited to protect the SiC surface. A pattern is defined with photoresist (thick enough to block the subsequent ion implant) such that windows are opened above the n-type doped regions in field areas.

A series of shallow nitrogen implants are performed to increase the n-type doping in these n-type field areas such that lateral parasitic pnp bipolar junction or PMOS field transistors are turned off. The photoresist material is then removed.

A pattern is defined with photoresist (thick enough to block the subsequent ion implantation) such that windows are opened above the p-type regions, in areas where transistors will be formed (to be referred to as active areas). A shallow nitrogen implant is performed to reduce the p-type doping in the p-well active areas such that the transistor threshold voltage is adjusted. The photoresist material is then removed. The thin dielectric layer is then removed.

All implants are annealed using a carbon cap to protect the SiC surface. The carbon cap material is then removed.

A field dielectric (such as silicon dioxide) is formed on the SiC surface. A pattern is defined with photoresist such that windows are opened in the dielectric where transistor active areas are required. The exposed dielectric is removed by etching from the active areas. The photoresist is removed.

A gate dielectric (such as silicon dioxide) and a gate electrode (such as polysilicon) 116, 134 are then formed on each of the field effect transistors. The dielectric layer may also be formed on the bipolar junction transistor as well.

SiC contacts can then be formed as follows. Thick $SiO_2$ is deposited. A pattern is defined with photoresist such that windows are opened where contacts are required to be made to underlying heavily doped p-type SiC and heavily doped n-type SiC regions within active areas. The exposed $SiO_2$ is removed by etching from the contact areas. The photoresist is removed.

Metal for forming ohmic contacts to the heavily doped n-type SiC is deposited. A pattern is defined with photoresist such that photoresist only remains above areas where the n-type SiC ohmic contact metal is required. The exposed n-type SiC ohmic contact metal is removed by etching. The photoresist is removed. The patterned ohmic contact metal is annealed to form ohmic contacts to the n-type SiC.

Metal for forming ohmic contacts to the heavily doped p-type SiC is then deposited. A pattern is defined with photoresist such that photoresist only remains above areas where p-type ohmic contact metal is required. The exposed p-type ohmic contact metal is removed by etching. The photoresist is removed. The patterned ohmic contact metal is annealed to form ohmic contacts to the p-type SiC.

Polysilicon contacts are then formed. A pattern is defined with photoresist such that windows are opened in the thick SiO2 where contacts are required to be made to underlying polysilicon. The exposed $SiO_2$ is removed by etching from the contact areas. The photoresist is removed.

Refractory interconnect metal can then be deposited if desired. A pattern is defined with photoresist such that photoresist only remains above areas where refractory interconnect metal is required. The exposed refractory interconnect metal is removed by etching, leaving refractory interconnect metal tracks and pads. The photoresist is removed.

Thick $SiO_2$ is deposited. A pattern is defined with photoresist such that windows are opened where external connections are required to refractory interconnect metal pads. The exposed $SiO_2$ is removed by etching from the pad areas. The photoresist is removed.

Through dopant engineering, the diode breakdowns between:

A. the heavily n-doped source/drain/collector/emitter and lightly p-doped body, and
B. the heavily p-doped source/drain/collector/emitter and the lightly n-doped body have been suppressed to allow 30V operation. Similarly, the punchthrough between the heavily n-doped source/drain/collector/emitter and heavily n-doped substrate has been suppressed to allow 30V operation.

A process for producing the full complementary BiCMOS of FIG. 6 will now be described. This process incorporates lateral NMOS, lateral PMOS and lateral npn and pnp bipolar transistors, all on the same SiC substrate. The pnp bipolar transistor is fabricated within a well area.

For the substrate a heavily n-doped 4H silicon carbide Si-face substrate (wafer) 102 is used. On top of this substrate, a p-type epitaxial layer 104 is deposited, the p-type epitaxial layer has a first zone of p-type doping 104a in the concentration range of less than $2\times10^{18}$ cm$^{-3}$ that extends from the substrate to a depth of 0.3 μm. The p-type epitaxial layer also has a second zone 104b above the first zone 104a that has a depth of 1.2 μm and a dopant concentration of less than $2\times10^{17}$ cm$^{-3}$ and less than the first zone. There is therefore a greater concentration of p-type dopant within the p-type epitaxial layer towards the substrate.

A dielectric material (such as silicon dioxide) that is thick enough to block the subsequent ion implantation is deposited on top of the epitaxial layer. A pattern is defined in the dielectric such that areas to be retained as p-type epitaxial regions 118, 120 remain blocked by overlying dielectric, and regions 108, 109 to be implanted with n-type dopant throughout the full depth of the p-type epitaxial layer have the dielectric removed.

A series of nitrogen implants, up to an energy of 2 MeV, are performed so that a lower portion of the p-type epitaxial layer is implanted n-type for the regions 108, 109 that are to be n-type doped throughout the full depth at a concentration of $1\times10^{18}$ cm$^{-3}$ to $1\times10^{19}$ cm$^{-3}$.

The dielectric is then further patterned such that the region 150 which will become an n-type well that does not extend to the substrate also have the dielectric removed. This means that only the p-type areas that are to be retained are now protected by dielectric. A series of nitrogen implants are performed such that all the n-type regions 108, 109, 150 are doped n-type. Implant energies are such that in the n-type well region 150, the dopant is distributed from the middle to the top of the p-type epitaxial material, leaving the lower p-type epitaxial material unimplanted. For the other n-type regions 108, 109, these nitrogen implants result in the full thickness of the p-type epitaxial material being n-type doped. These implanted regions have first zones 108a, 109a, 150a having a higher n-type dopant concentration of $1\times10^{18}$ cm$^{-3}$ to $1\times10^{19}$ cm$^{-3}$ and second zones 108b, 109b, 150b of a lower n-type dopant concentration of $1\times10^{16}$ cm$^{-3}$ to $1\times10^{18}$ cm$^{-3}$. A low energy threshold adjust implant of either aluminium or nitrogen may also be performed at this stage. The dielectric layers are then removed.

Next, further dielectric material (such as $SiO_2$) thick enough to block the subsequent ion implantation is deposited on top of the wafer. A pattern is defined in the dielectric such that windows are opened where heavily doped n-type implanted regions are required for n-channel MOS device source and drain 122, 124, for p-channel MOS device body contacts 125, for npn bipolar transistor collector and emitter 126, 128 and for pnp bipolar transistor base contact 166. A series of shallow phosphorous implants are performed to create the required n-type doping profile. The dielectric layers are then removed.

Dielectric material (such as $SiO_2$) thick enough to block the subsequent ion implantation are deposited on top of the wafer. A pattern is defined in the dielectric such that windows are opened where heavily doped p-type implanted regions are required for p-channel MOS device source and drain 110, 112, for n-channel MOS device body contact 123, for pnp bipolar transistor collector and emitter 149, 151 and for npn bipolar transistor base contact 127. A series of shallow aluminium implants are performed to create the required heavily doped p-type doping profile. The dielectric layers are then removed.

Dielectric material thick enough to block the subsequent ion implantation is deposited on top of the wafer. A pattern is defined in the dielectric such that windows are opened above the p-type region in areas where transistors will not be formed (to be referred to as field areas).

A series of shallow aluminium implants are performed to increase the p-type doping in the p-type field areas such that lateral parasitic npn bipolar junction or NMOS field transistors are turned off. The dielectric layers are then removed.

A thin dielectric layer (such as silicon dioxide) is deposited to protect the SiC surface. A pattern is defined with photoresist (thick enough to block the subsequent ion implant) such that windows are opened above the n-type doped regions in field areas.

A series of shallow nitrogen implants are performed to increase the n-type doping in these n-type field areas such that lateral parasitic pnp bipolar junction or PMOS field transistors are turned off. The photoresist material is then removed.

A pattern is defined with photoresist (thick enough to block the subsequent ion implantation) such that windows are opened above the p-type regions, in areas where transistors will be formed (to be referred to as active areas). A shallow nitrogen implant is performed to reduce the p-type doping in the p-type active areas such that the transistor threshold voltage is adjusted. The photoresist material is then removed. The thin dielectric layer is then removed.

All implants are annealed using a carbon cap to protect the SiC surface. The carbon cap material is then removed.

A field dielectric (such as silicon dioxide) is formed on the SiC surface. A pattern is defined with photoresist such that windows are opened in the dielectric where transistor active areas are required. The exposed dielectric is removed by etching from the active areas. The photoresist is removed.

A gate dielectric (such as silicon dioxide) and a gate electrode (such as polysilicon) 116, 134 are then formed on each of the field effect transistors. The dielectric layer may also be formed on the bipolar junction transistors as well.

Contacts can then be formed as follows. Thick SiO$_2$ is deposited. A pattern is defined with photoresist such that windows are opened where contacts are required to be made to underlying heavily doped p-type SiC and heavily doped n-type SiC regions within active areas. The exposed SiO$_2$ is removed by etching from the contact areas. The photoresist is removed.

Metal for forming ohmic contacts to the heavily doped n-type SiC is deposited. A pattern is defined with photoresist such that photoresist only remains above areas where the n-type SiC ohmic contact metal is required. The exposed n-type SiC ohmic contact metal is removed by etching. The photoresist is removed. The patterned ohmic contact metal is annealed to form ohmic contacts to the n-type SiC.

Metal for forming ohmic contacts to the heavily doped p-type SiC is then deposited. A pattern is defined with photoresist such that photoresist only remains above areas where p-type ohmic contact metal is required. The exposed p-type ohmic contact metal is removed by etching. The photoresist is removed. The patterned ohmic contact metal is annealed to form ohmic contacts to the p-type SiC.

Polysilicon contacts are then formed. A pattern is defined with photoresist such that windows are opened in the thick SiO2 where contacts are required to be made to underlying polysilicon. The exposed SiO$_2$ is removed by etching from the contact areas. The photoresist is removed.

Refractory interconnect metal can then be deposited if desired. A pattern is defined with photoresist such that photoresist only remains above areas where refractory interconnect metal is required. The exposed refractory interconnect metal is removed by etching, leaving refractory interconnect metal tracks and pads. The photoresist is removed.

Thick SiO$_2$ is deposited. A pattern is defined with photoresist such that windows are opened where external connections are required to refractory interconnect metal pads. The exposed SiO$_2$ is removed by etching from the pad areas. The photoresist is removed.

Through dopant engineering, the diode breakdowns between:
  A. the heavily n-doped source/drain/collector/emitter and lightly p-doped body, and
  B. the heavily p-doped source/drain/collector/emitter and the lightly n-doped body have been suppressed to allow 30V operation.

Through controlling the variation in the concentration of the dopant, the vertical parasitic bipolar transistors indicated in FIG. 6 have been suppressed:
  A. the parasitic vertical npn bipolar transistor between the heavily doped n-type region of source/drain and the heavily doped n-type substrate has been suppressed and punchthrough limited to allow 30V operation
  B. the parasitic vertical pnp bipolar transistor between the heavily doped p-type emitter/collector and the p-type epitaxial layer has been suppressed and punchthrough limited to allow 30V operation
  C. the parasitic vertical npn bipolar transistor between the n-well and heavily doped n-type substrate has been suppressed and punchthrough limited to allow 30V operation.

The foregoing provides a description of the present invention, however, it should not be considered limiting. The present invention is defined by the following claims.

What is claimed is:

1. A method of manufacturing an integrated circuit, wherein the method comprises:
  obtaining a silicon carbide substrate of a first conductivity type, wherein a silicon carbide epitaxial layer is present on the silicon carbide substrate, wherein the epitaxial layer comprises:
  a first region of the first conductivity type, the first region comprising a first transistor of a first junction type;
  a second region of a second conductivity type, the second region comprising a second transistor of a second junction type;
  a third region of the second conductivity type, the third region comprising a third transistor of the second junction type;
  a uniformly doped n-type conductivity region between the second and third regions, wherein the n-type conductivity region extends the depth of the epitaxial layer to contact the substrate,
  wherein the first region, second region and the third region extend the depth of the epitaxial layer to the substrate, wherein the dopant of the first type is an n-type dopant, the first conductivity type is n-type conductivity and the second conductivity type is p-type conductivity, and wherein the n-type dopant implanted to form the first region is nitrogen,
  wherein the first and second conductivity types electrically isolate adjacent ones of the regions having different conductivity types;
  an isolation layer on the uniformly doped n-type conductivity region; and
  a capacitor above the isolation layer, the capacitor comprising first and second conductive layers and an insulating layer.

2. The method of claim 1, wherein the first transistor and the second transistor have a lateral layout.

3. The method of claim 1, wherein the n-type dopant implanted to form the first region is nitrogen.

4. The method of claim 1, wherein the third transistor has a lateral layout.

5. The method of claim 1, wherein the concentration of the dopant of the second type within the second region is greater towards an interface of the second region with the substrate relative to the concentration between the junctions of the second transistor; and the concentration of the dopant of the second type within the third region is greater towards the interface of the third region with the substrate relative to the concentration between the junctions of the third transistor.

6. The method of claim 1, further comprising implanting a dopant of the first type to form a fourth region of the first conductivity type in the epitaxial layer of the second conductivity type, wherein the fourth region is in the form of a well and does not extend the depth of the epitaxial layer to the substrate.

7. The method of claim 6, further comprising forming a fourth transistor in the fourth region of the first conductivity type.

8. The method of claim 7, wherein the fourth transistor has a lateral layout.

9. The method of claim 7, wherein the concentration of dopant of the first type within the fourth region is greater towards the bottom of the fourth region relative to the concentration between the junctions of the fourth transistor, wherein the bottom of the fourth region lies between the fourth transistor and the substrate.

10. The method of claim 7, wherein the fourth transistor is a bipolar junction transistor having a base type corresponding to the first conductivity type or a field effect transistor having a channel type corresponding to the second conductivity type.

11. The method of claim 7, wherein forming the fourth transistor comprises implanting a dopant of a second type to form collector/source and emitter/drain regions of the second conductivity type.

12. The method of claim 1, wherein the third transistor is a bipolar junction transistor having a base type corresponding to the second conductivity type or a field effect transistor having a channel type corresponding to the first conductivity type.

13. The method of claim 12, wherein the step of forming the third transistor comprises implanting a dopant of the first type to form collector/source and emitter/drain regions of the first conductivity type.

14. The method of claim 1, wherein the first transistor is a field effect transistor having a channel type corresponding to the second conductivity type and the second transistor is a field effect transistor having a channel type corresponding to the first conductivity type.

15. The method of claim 14, wherein forming the first transistor comprises implanting the dopant of a second type to form source and drain regions of the second conductivity type; and the step of forming the second transistor comprises implanting the dopant of the first type to form source and drain regions of the first conductivity type.

16. The method of claim 1, further comprising forming a LDMOS transistor in the epitaxial layer, wherein forming the LDMOS transistor comprises:
    forming a drain extension region of the first conductivity type in the epitaxial layer of the second conductivity type;
    forming a source region of the first conductivity type in the epitaxial layer of the second conductivity type, wherein the drain extension region and the source region are separated by the epitaxial layer of the second conductivity type; and
    forming a drain region of relatively heavily doped first conductivity type within the drain extension region of the first conductivity type.

17. The method according to claim 1, further comprising forming an interconnect layer that provides connections to the transistors.

* * * * *